United States Patent [19]

Streeter

[11] Patent Number: 5,175,877
[45] Date of Patent: Dec. 29, 1992

[54] APPARATUS AND METHOD FOR GENERATING AN AMPLITUDE MODULATED RF SIGNAL

[75] Inventor: Robert D. Streeter, Fort Wayne, Ind.

[73] Assignee: Magnavox Electronic Systems Company, Allen County, Ind.

[21] Appl. No.: 494,022

[22] Filed: Mar. 15, 1990

[51] Int. Cl.⁵ .............................................. H04B 1/66
[52] U.S. Cl. ................................... 455/102; 455/108; 332/108; 332/151
[58] Field of Search .............. 455/102, 108, 126, 127, 455/116; 332/108, 151, 183; 330/10, 207 A, 251

[56] References Cited

U.S. PATENT DOCUMENTS

| | | | |
|---|---|---|---|
| 3,413,570 | 11/1968 | Bruene et al. | 455/108 |
| 4,044,308 | 8/1977 | Stites et al. | 455/116 |
| 4,320,391 | 3/1982 | Mallett | 332/151 |
| 4,723,308 | 2/1988 | Kobayashi et al. | 455/108 |
| 4,896,372 | 1/1990 | Weaver | 455/108 |

OTHER PUBLICATIONS

Technical Manual, HARRIS MW-50A 50KW Medium Wave AM Broadcast Transmitter-pp. 1-1, 1-2, 1-3, 1-5, 1-6, 4-2, and 4-5 and FIGS. 4-1, 9-3, 9-4, 9-5 and 9-11.
Solid State Radio Engineering, Krauss, Bostian and Raab, Published by John Wiley & Sons-pp. 410-412 and 490-498.
Communication Circuits: Analysis and Design, Clarke, Hess and Addison, published by Wesley Publishing Company-pp. 353-361, 387-392 and 447-450.
VHF/AM Transmitter Using VMOS Technology, Petrovic and Gosling, Electronic Engineering, Jun. 1978-pp. 65-67.
Collector Amplitude Modulation of The Class E Tuned Power Amplifier, Kazimierczuk, IEEE Transactions on Circuits & Systems, vol. CAS-31, No. 6, Jun. 1984-pp. 543-549.
Optimal Design of the High-Power Plate and Grid Modulated HF Amplifier by High Modulation Levels, Zivkovic-Dzunja and Markovic, IEEE Transactions on Broadcasting, vol. BC-33, No. 2, Jun. 1987-pp. 52-58.
Efficiency Modulation is Rare, Vernon, Radio World, Jul. 15, 1987—p. 23.
Concept and Design of an 800W UHF Power Amplifier, Wickenhaeuser, RF Technology Expo 88, Feb. 10-12, 1988—pp. 13-35.

*Primary Examiner*—Reinhard J. Eisenzopf
*Assistant Examiner*—Edward Urban

[57] ABSTRACT

An amplitude modulated RF amplifier using dual path modulation to increase operating efficiency. Both the RF drive to the amplifier and the DC power supply voltage to the amplifier are amplitude modulated. Preferably, the power supply modulation is accomplished with a high efficiency pulse width modulator circuit. To prevent phase shift distortion, the modulated DC output from the power supply is used both to power the RF amplifier and to amplitude modulate the RF drive to the amplifier. For maximum efficiency, the modulators are both non-linear. Maximum efficiency is realized with primarily supply modulation and some drive modulation providing the positive envelope modulation and primarily a non-linear RF drive modulation providing the negative envelope modulation. The use of primarily RF drive modulation for the deep negative modulation will reduce the amount of incidental phase modulation experienced, while having a nearly inconsequential effect on total efficiency of the RF amplifier.

13 Claims, 2 Drawing Sheets

APPARATUS AND METHOD FOR GENERATING AN AMPLITUDE MODULATED RF SIGNAL

TECHNICAL FIELD

The invention relates to modulators and more particularly to an amplitude modulated radio frequency amplifier having dual path modulation for improved operating efficiency.

BACKGROUND ART

Amplitude modulated radio frequency amplifiers operating in the VHF and UHF frequencies operate at a low efficiency. Current VHF and UHF transmitter RF power amplifiers are relatively poor in converting primary DC power input to RF output energy available for communication. For mobile and portable transmitters, the end result of the low efficiency is a restrictive communications range and, for military applications, a reduced immunity to interfering signals (reduced jam margin). Typically, conversion efficiencies are less then 20%. This means that a radiated 10 watt RF carrier power output signal requires a combined DC input power and RF drive power of at least 50 watts to the transmitter final amplifier section. The 40 watts (or more) that do not appear in the RF output power are lost as heat within the output stage of the amplifier. The inefficiency of the RF power amplifier not only contributes a problem with excessive heat which must be dissipated, but the generated heat also is involved with an attendant reduction in reliability of the RF amplifier. The associated DC power supply for operating the amplifier must be of a sufficient size to supply the wasted power, thereby significantly increasing the total weight of the unit.

Because of the low operating efficiency of the amplifier, there is a significant limitation on the available RF power output which can be produced from limited capacity power source, such as a battery. By limiting the RF power available for communications, the communication range is limited and the transmitted signal is more susceptible to jamming. On the other hand, any increase in the available RF power achieved by increased circuit efficiency will permit greater communications distance and greater immunity to jamming without an increase in power consumption. Or, an improvement in power amplifier efficiency may be used to achieve an increased battery life without a reduction in the RF output power. Since an increase in efficiency results in less heat generation, there also will be an increase in equipment reliability and an opportunity to reduce equipment weight.

The efficiency of an RF amplifier is primarily determined by the power loss in the active device(s) used in the circuit, e.g., a power transistor or a vacuum tube, and by the losses in the passive circuit components, e.g., matching networks, filters, etc. The power loss in an active device is primarily determined by the instantaneous current through and the instantaneous voltage across the device output element. The active device drive signal characteristics usually have a smaller impact on efficiency. Improvements in operating efficiency usually come from improvements in the characteristics of the instantaneous current through and the instantaneous voltage across the active device output element. These improvements are related to the transfer characteristics of the device selected, and to the operating point chosen for the device. The impact of circuit configuration should be secondary in its impact on efficiency. However, practical considerations and specialized designs often do cause the selected circuit topology to influence the amplifier efficiency.

Normally, amplitude modulation for VHF/UHF military transmitters is achieved by audio rate variation of the RF drive signal (envelope modulation of the RF drive) for the power amplifier. Attempts have been made to operate an RF power amplifier at a more efficient operating point by modulating the DC power for the amplifier rather then the RF drive. Early attempts at output envelope modulation by power supply variation have been found to lead to large amounts of incidental frequency modulation. The physical separation of the output amplifier from the low power RF drive system has encouraged prior attempts at power supply modulation to be performed only on the output amplifier. The RF drive was operated at a predetermined level and was held constant while the output amplifier was modulated by power supply variation. The use of a constant RF drive on the modulated amplifier causes a significant RF overdrive during negative modulation peaks. Similarly, the amplifier is significantly under-driven during positive modulation peaks. This causes modulation transfer non-linearity. The excess drive in the negative peaks tends to be coupled into the output signal, but with a major phase offset. The drive feedthrough phase offsets, plus the phase and propagation delay variations in the device as a result of supply modulation, creates a significant angular modulation as a consequence of the supply variation modulation technique and the RF overdrive. Thus, prior power supply modulation efforts to obtain an increased efficiency concentrated on a constant RF drive to the power amplifier stage and experienced significant incidental angular modulation. This discouraged the use of efficient operating point control techniques.

DISCLOSURE OF INVENTION

It has been found that a dual path modulation technique may be used to alleviate much of the detrimental effects previously noted in attempts to improve RF power amplifier operating efficiency through power supply voltage modulation. Through the techniques, both the power supply voltage to an RF power amplifier and the RF drive to the amplifier are amplitude modulated to achieve an efficient operating point for the amplifier at all levels of modulation. Overall performance similar to existing products is obtainable with a significant increase in operating efficiency. Prior art RF power amplifiers driven by an amplitude modulated RF drive signal typically operate an no more then 20% average efficiency. The actual efficiency will vary with various factors including the nature of the input signal used to modulate the RF drive (e.g., sinusoidal waveform or square wave), the percentage of modulation, and the operating voltage for the amplifier. Through the use of dual path modulation, efficiency improvements for the RF output devices of up to nearly double the present efficiency are obtainable.

According to the invention, an audio or other low frequency input signal is used to modulate the DC power supply voltage for operating an RF power amplifier. The power supply voltage may be modulated by various known techniques, for example, through the use of a high efficiency pulse width modulator. The amplitude modulated voltage is applied to the DC supply input of the RF power amplifier and also is used to amplitude modulate the RF drive signal applied to the power amplifier. Through the use of dual path (power supply and RF drive) modulation, the amplifier can be operated at the optimum efficiency operating point for all levels of modulation. Through modulation of the RF drive in addition to the power supply, prior art problems with over-drive during negative modulation peaks and underdrive during positive modulation peaks can be eliminated. Finally, by using the voltage modulated output from the power supply both for powering the amplifier and for modulating the RF drive to the amplifier, the possibility of phase shift distortion in the modulated output RF envelope of the amplifier is eliminated or minimized.

Accordingly, it is an object of the invention to provide an improved efficiency RF power amplifier through the use of dual path modulation.

Other objects and advantages of the invention will be apparent from the following description and the accompanying drawings.

BEST MODE FOR CARRYING OUT THE INVENTION

Figure 1:
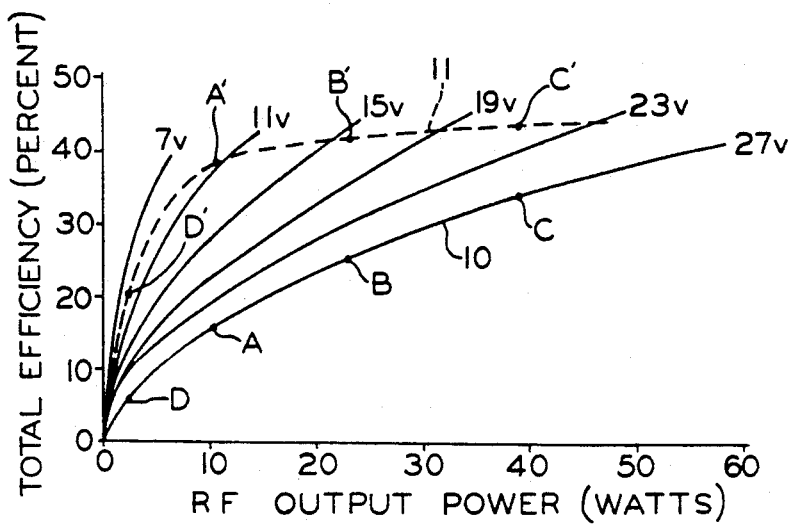
FIG. 1 is a graph showing efficiency vs. output power for an exemplary prior art RF drive modulated RF power amplifier for various power supply voltages and showing by a dashed line a possible efficiency vs. output power for the same amplifier operated with dual path amplitude modulation according to the invention.

The output power and total operating efficiency for an RF power amplifier are determined by various factors, including supply voltage and operating point. In order to better understand the operation of an exemplary RF power amplifier, FIG. 1 is a graph illustrating a family of operating point curves for various DC power supply voltages for the amplifier when operated at 225 MHz. The information on the graph is plotted to show total efficiency as a function of RF output power, with RF drive power and DC supply voltage as parameters of variation to generate a family of curves. Each solid curve is plotted to represent a line of operating points for the amplifier for increasing RF drive at a specified DC primary supply voltage to the RF power amplifier. For any given DC supply voltage to the amplifier, the curve shows an increase in both output power and total efficiency with an increase in the RF drive. For any given operating point for the amplifier, the total efficiency of the amplifier is calculated by the following formula:

$$\text{Total Efficiency} = \frac{RF \text{ Output Power}}{RF \text{ Input Power} + DC \text{ Input Power}}.$$

A curve 10 in FIG. 1 shows the family of operating points for the RF power amplifier when operated from a 27 volts primary DC power supply. Other exemplary curves are shown for the indicated lower primary DC power supply voltage. The point A on the curve 10 may represent the amplifier operating point when the RF input is a constant carrier at a level selected to provide 10 watts of output power from the RF amplifier. The point B on the curve 10 may represent 50% positive peak modulation of the carrier by a 1 KHz sine wave input signal and the point C may represent 100% positive peak modulation of the carrier. The point D on the curve 10 may represent 50% negative peak modulation of the carrier. Typically, a decrease in the DC operating voltage for the amplifier with a constant RF drive will result in a decrease in the output power and either substantially the same or a higher operating efficiency for the amplifier.

The dashed line curve 11 represents the operating points and resulting efficiency increases which are obtainable through the use of dual path modulation according to the invention. With dual path modulation, any change in the magnitude of the input signal will result in a corresponding change both in the magnitude of the DC operating voltage for the amplifier and in the operating point on the operating voltage curve. A pure unmodulated carrier may have an operating point A', a 50% positive peak modulated carrier may have an operating point B', a 100 % positive peak modulated carrier may have an operating point C' and a 50% negative peak modulated carrier may have an operating point D'. As will be seen from the exemplary curve 11, the DC voltage applied to the amplifier may be at about 22 volts for 100% positive peak modulation, 15 volts for 50% positive peak modulation, 12 volts for the unmodulated carrier and 9 volts for 50% negative peak modulation. Of course, the actual operating points for each level of modulation for maximum efficiency must be determined for each specific amplifier circuit and components. From comparing the exemplary curve 11 with any of the fixed voltage curves on the graph of FIG. 1, it will be appreciated that a significant increase in efficiency at higher RF output power may be obtained through the use of dual path modulation.

Figure 2:
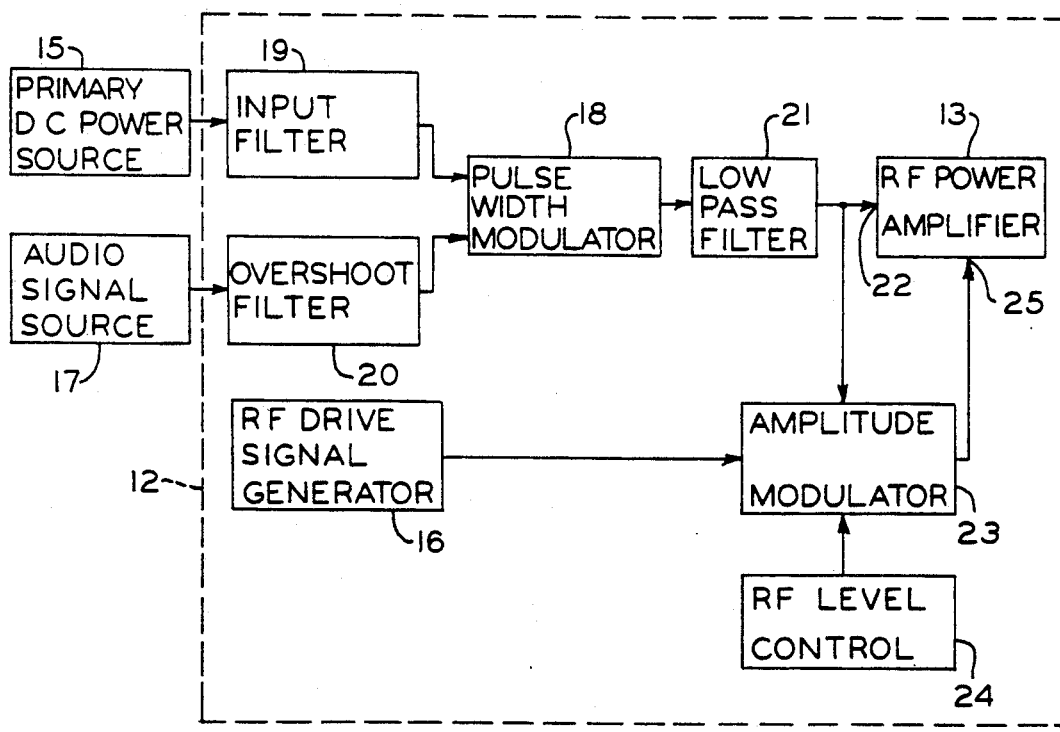
FIG. 2 is a block diagram of a transmitter having a dual path amplitude modulated RF amplifier according to the invention.

Turning now to FIG. 2, a block diagram is shown for a communications transmitter 12 having dual path amplitude modulation of an RF power amplifier 13 in accordance with the invention. For the following discussion, the amplifier 13 is the final output stage in the transmitter 12. However, it will be appreciated that the RF power amplifier 13 may be used for other applications which will be apparent to those skilled in the art. The transmitter 12 is operated from a suitable primary DC power source 15, such as a battery (not shown).

The transmitter 12 includes a conventional RF carrier drive signal generator 16, such as a crystal controlled oscillator or a frequency synthesizer and appropriate amplifier stages. The transmitter 12 further is connected to a conventional source 17 for an input signal which must be communicated, in this case an audio signal source. The audio signal source, for example, may comprise a microphone and an audio amplifier. Of course, the audio signal source may consist of other known types of analog or digital signal sources which operate in the low or audio frequency range.

The fixed voltage output from the primary DC power source 15 is modulated with the audio signal from the source 17 and is applied to the RF power amplifier 13 as a source of operating power. This may be achieved through the use of a DC voltage modulator, such as a pulse width modulator 18 and appropriate filters. Note that although various DC modulators will operate in the dual path modulator of the invention with improvements in the efficiency of the RF amplifier, the use of a high efficiency DC voltage modulator such as a high efficiency pulse width modulator will provide a total improvement in the efficiency of the process of obtaining a modulated voltage. The output voltage from the source 15 is applied through an input filter 19 to the pulse width modulator 18 and the audio output from the source 17 is applied either directly or, optionally, through an overshoot filter 20 to the pulse width modulator 18. The output from the pulse width modulator 18 is passed through a low pass filter 21 and applied as a modulated DC voltage to a DC power supply input 22 to the RF amplifier 13. The actual voltage operating range for the amplifier 13 will depend on the operating properties of each particular amplifier design and particularly on the operating point efficiencies of the active device(s) in the amplifier. For the amplifier represented by the curve 11 in FIG. 1, the voltage applied to the amplifier input 22 is modulated between about 9 volts and about 22 volts. It is important to prevent the DC supply voltage to the RF amplifier 13 from being modulated to too low of a value. If the DC supply voltage drops too low, the junction capacitance within the active device in the RF amplifier 13 will change and there will be excessive incidental phase modulation of the carrier signal. The negative envelope peaks in the output from the amplifier 13 should be primarily obtained through RF drive modulation to reduce incidental phase modulation.

The carrier from the RF drive signal generator 16 and the modulated DC voltage from the low pass filter 21 are applied to a modulator or mixer 23 which combines the modulated DC voltage and the carrier to produce a modulated RF drive signal. The transmit carrier level of the drive signal is determined by an RF level control 24, which may consist of a manual level adjustment. The RF drive signal from the mixer 23 is applied to an RF drive input 25 to the RF amplifier 13. Although the audio signal which is used to modulate the carrier may be obtained from other locations in the transmitter circuit, it is preferable to use a small portion of the modulated DC voltage from the low pass filter 21 to amplitude modulate the carrier. This avoids any phase differences in the modulated supply voltage and the modulated RF drive signal applied to the amplifier 13, which would result in distortion in the RF output from the amplifier 13. The mixer 23 may be operated as a linear RF drive modulator. This will result in some small sacrifice in the total efficiency of the power amplifier 13. As will be discussed below, maximum efficiency improvement is obtained with both non-linear RF drive modulation and non-linear DC supply voltage modulation. For any particular circuit design for the amplifier 13, the maximum efficiency point must be measured for various levels of modulation and such measurements must be used in establishing the non-linear drive modulation for optimum efficiency. It should be noted that the modulation range of the supply voltage applied to the amplifier 13 as well as the operating characteristics of the amplifier 13 determine the location and shape of the curve 11 in FIG. 1. The carrier level and the level of modulation of the RF drive signal applied to the amplifier input 25 will determine the operating point of the amplifier 13 on the curve 11.

Figure 3:
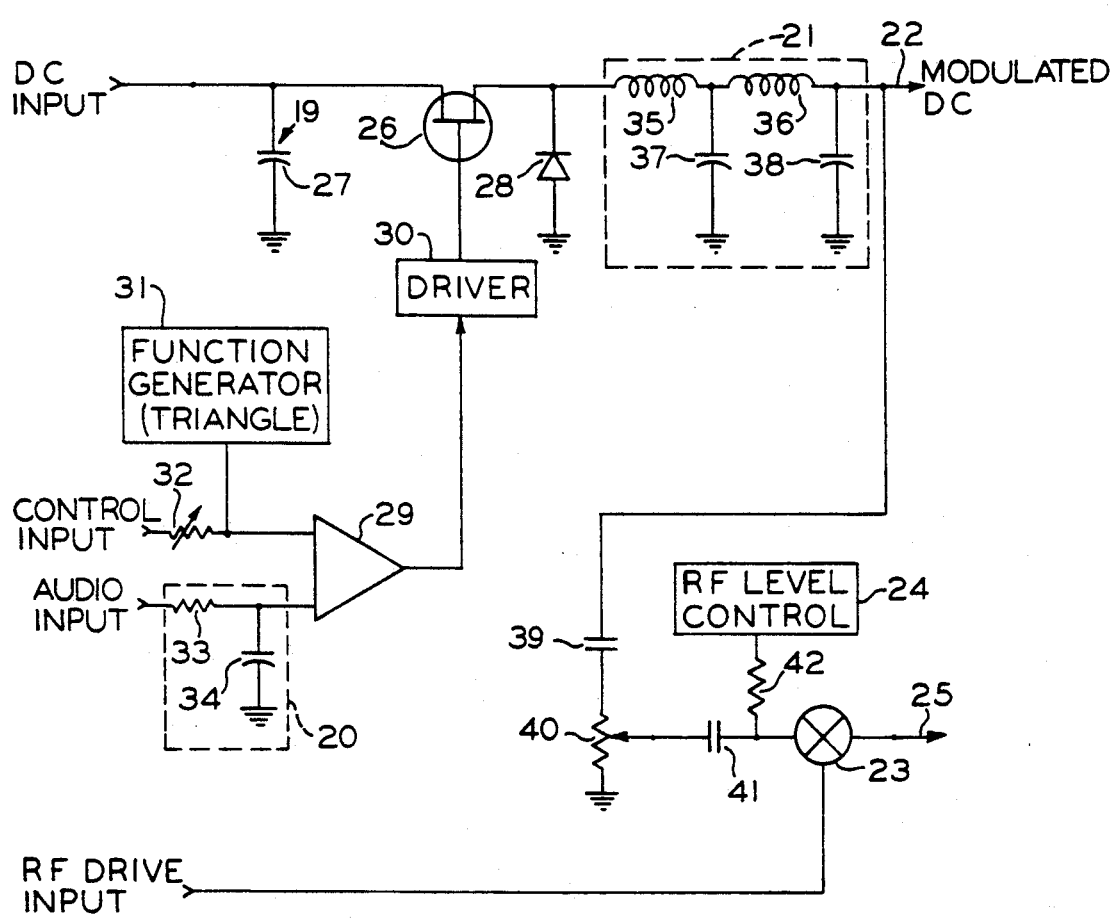
FIG. 3 is a schematic circuit diagram of the pulse width modulator and related filters for amplitude modulating the DC power for the RF amplifier of FIG. 2 and of the mixer connections for amplitude modulating the RF drive for the amplifier.

FIG. 3 is a circuit diagram for the pulse width modulator 18 and the related input filter 19, overshoot filter 20 and low pass filter 21 and of the connections for the RF drive modulator 23 from FIG. 2. The pulse width modulator 18 (FIG. 2) has an output voltage equal to the duty cycle of the switching frequency times the DC voltage of the primary source 15 (FIG. 2). Preferably, a power MOSFET 26 is used as the switch because of its low "on" resistance and high speed switching capabilities. The constant DC voltage from the primary source 15 (FIG. 2) is applied to the source electrode of the MOSFET 26. A capacitor 27 is also connected between the source electrode and ground to serve as the input filter 19. The drain electrode of the MOSFET 26 is connected through a diode 28 to ground and to the low pass filter 21.

A comparator 29 has a pulse output which is applied through a driver 30 to the gate electrode of the MOSFET 26 for turning the MOSFET 26 on and off. The comparator 29 compares an input from a function generator 31 with the audio signal from the source 17 (FIG. 2). The function generator 31 generates a high frequency triangular waveform, for example, at a frequency of approximately 200 KHz. A control input is connected through a resistor 32 to add an adjustable DC offset voltage to the output from the function generator 31. Note that the output impedance of the function generator 31 must be compatible with the selection of the resistance value for the resistor 32 in order to provide a reasonable current summation effect at the input to the comparator 29. In selecting the frequency for the function generator 31, the design of the low pass filter 21 should be considered. The audio signal from the source 17 (FIG. 2) is applied to the comparator 29 through the overshoot filter 20 which is a low pass filter consisting of a series resistor 33 and a capacitor 34 connected to ground. The duty cycle of the pulse train output of the comparator 29 determines the operating point of the pulse width modulator 18. A fixed change in the duty cycle of the resultant pulse train may be caused by changing the level of the DC control input. It is added as a DC offset to the pulse train from the function generator 31. The audio input to the comparator 29 creates a variable change (at the audio rate) in the duty cycle of the comparator 29. As a consequence, the MOSFET 26 will also have a variable (audio) duty cycle pulse output at the switching frequency of the function generator 31. This pulse signal is smoothed into a modulated DC voltage by the filter 21.

A further variable change may be made by controlling the operation of the comparator 29 at its audio input in response to the voltage level of the primary DC power source 15 input to the pulse width modulator. By varying the DC offset of the audio input, the pulse width modulator 18 behaves as a "bucking" type regulated power supply in addition to all other tasks it performs. Changes in the voltage of the primary DC power source are corrected by counter-acting changes in the pulse width of the pulse width modulator output. This helps maintain the average value of the supply voltage to the RF amplifier at the target optimum value for maximum RF amplifier efficiency.

The low pass filter 21 is a 4 element filter consisting of two inductors 35 and 36 and two capacitors 37 and 38. The low pass filter 21 eliminates spikes which would appear as spurious sideband signals on the transmitted RF signal. Where the function generator 31 operates at a frequency of 200 KHz, a low pass filter 21 having a 3 dB rolloff point at approximately 19 KHz and a response of approximately −80 dB at 200 KHz was effective. The diode 28 provides a path for reverse currents from the filter 21 when the MOSFET 26 is switched off. The optional overshoot filter 20 is provided to compensate for the overshoot characteristics of the 4 element low pass filter 21. The overshoot filter 20 is required only where the modulation overshoot and ringing performance is tightly specified.

The modulator 23 may be an amplitude modulator of known design. Where linear modulation is desired, the modulator 23 may be a commercially available frequency mixer, such as a model ZAD-1 frequency mixer manufactured and sold by Mini-Circuits of Brooklyn, New York. The modulated DC output from the low pass filter 21 is connected through a series capacitor 39 and potentiometer 40 to ground. The tap on the potentiometer 40 is connected through a capacitor 41 to the low frequency input to the mixer 23 and the RF drive input is applied to an RF input to the mixer 23. If the audio input to the mixer 23 has a zero volt reference, the mixer 23 will produce a carrier suppressed double sideband RF output. A DC unbalancing circuit is required to deliver a carrier to the power amplifier 13. The RF level control 24 merely consists of an adjustable low voltage DC power supply with a series resistor 42. The low voltage current is summed with the audio signal at the input port to the mixer 23. The DC serves to unbalance the input port of the mixer 23, thus reducing the input balance and creating a carrier signal at the RF port. Increasing the DC control signal will increase the level of the carrier applied to the RF power amplifier input 25. The adjustment of the RF level by use of the DC offset also requires the level of the applied audio signal to be adjusted in order to obtain the desired degree of envelope modulation. The modulation level is adjusted by the potentiometer 40.

The degree of modulation obtained from the RF amplifier is usually greater than the modulation variations of either the supply or the RF drive viewed alone. The combination of the two modulation paths provides an overall greater output modulation than either path alone. The maximum efficiency improvement results from a non-linear supply variation and an associated non-linear RF drive variation. It should be apparent from FIG. 1 that the maximum efficiency will be realized with primarily supply modulation and some drive modulation providing the positive envelope modulation and a primarily non-linear RF drive modulation providing the negative envelope modulation. The use of primarily RF drive modulation for the deep negative modulation will reduce the amount of incidental phase modulation experienced, while having a nearly inconsequential effect on total efficiency of the RF amplifier.

Although the dual path amplitude modulated RF amplifier of the invention has been described and incorporated in an audio signal transmitter, it will be appreciated that the invention is suitable for other applications. The RF amplifier is equally applicable to digital signal transmitters and to applications other than the final stage of a transmitter. In the described preferred embodiment of the invention, the voltage from the DC power source is amplitude modulated with a pulse width modulator and appropriate filters and the RF drive is modulated with a frequency mixer. In the broadest aspects of the invention, other known types of DC and RF modulators may be adapted to modulate the power supply voltage and the RF drive, respectively. It also should be noted that the efficiency improvements will vary with the overall RF power amplifier design. However, significant improvements should be obtainable compared to an RF amplifier that currently utilizes RF drive control exclusively as a means of RF output power control and amplitude modulation control. It will be appreciated that various other modifications and changes may be made to the above described preferred embodiment of the invention without departing from the spirit and the scope of the following claims.

I claim:

1. Apparatus for generating an amplitude modulated RF signal from a DC supply voltage, an RF drive signal and a variable input signal, comprising, in combination, RF power amplifier means for producing said RF signal in response to a DC power input and an RF drive input, pulse width modulator means responsive to said variable input signal for amplitude modulating said DC supply voltage, means for applying said modulate DC voltage to said amplifier DC power input, means responsive to said amplitude modulated DC voltage for amplitude modulating said RF drive signal, means for applying said modulated RF drive signal to said amplifier RF drive input, and wherein said pulse width modulator means includes means for generating a triangular wave first pulse train having a predetermined frequency, means comparing said variable input signal with said first pulse train for producing a second pulse train having said predetermined frequency and a variable duty cycle related to said variable input signal, and switching means responsive to said second pulse train for amplitude modulating the DC supply voltage.

2. Apparatus for generating an amplitude modulated RF signal from a DC supply voltage, an RF drive signal and a variable input signal, as set forth in claim 1, and including means for compensating the output from said pulse width modulator for variations in the DC supply voltage.

3. Apparatus for generating an amplitude modulated RF signal from a DC supply voltage, an RF drive signal and a variable input signal, as set forth in claim 1, wherein said means responsive to said variable input signal for amplitude modulating said RF drive signal comprises a frequency mixer, said frequency mixer combining said RF drive signal and said amplitude modulated DC voltage.

4. Apparatus for generating an amplitude modulated RF signal from a DC supply voltage, an RF drive signal and a variable signal, as set forth in claim 3, wherein said frequency mixer non-linearly modulates said RF drive signal.

5. Apparatus for generating an amplitude modulated RF signal from a DC supply voltage, an RF drive signal and a variable signal, as set forth in claim 3, wherein said frequency mixer includes means for controlling the carrier level and the modulation level of said modulated RF drive signal to optimize the efficiency of said RF power amplifier.

6. A high efficiency method for operating an RF power amplifier for an amplitude modulated RF signal, aid amplifier having DC power and RF drive inputs, said method comprising the steps of amplitude modulating a DC supply voltage in response to a variable input signal, applying said amplitude modulated DC voltage to said amplifier DC power input, generating an RF drive signal, amplitude modulating said RF drive signal in response to said variable input signal, applying said modulated RF drive signal to said amplifier RF drive input, and wherein positive envelope modulation of the RF output from said amplifier results primarily from said modulated DC voltage and wherein negative envelope modulation of such RF output from said amplifier results primarily from said modulated RF drive signal.

7. A high efficiency method for operating an RF power amplifier for an amplitude modulated RF signal, as set forth in claim 6, wherein said DC supply voltage and said RF drive signal are modulated to operate said power amplifier at optimum efficiency.

8. A high efficiency method for operating an RF power amplifier for an amplitude modulated RF signal, as set forth in claim 6, wherein said DC supply voltage is nonlinearly amplitude modulated between a maximum voltage and a non-zero minimum voltage.

9. A high efficiency method for operating an RF power amplifier for an amplitude modulated RF signal, as set forth in claim 8, wherein said RF drive signal is non-linearly modulated.

10. A high efficiency method for operating an RF power amplifier for an amplitude modulated RF signal, as set forth in claim 9, wherein positive envelope modulation of the RF output from said amplifier results primarily from said modulated DC voltage and wherein negative envelope modulation of such RF output from said amplifier results primarily from said modulated RF drive signal.

11. A high efficiency method for operating an RF power amplifier for an amplitude modulated RF signal, as set forth in claim 6, and including the step of compensating said modulated DC voltage for any variations in the DC supply voltage.

12. Apparatus for generating an amplitude modulated RF signal from a DC supply voltage, and RF drive signal and a variable input signal, comprising, in combination, RF power amplifier means for producing said RF signal in response to a DC power input and an RF drive input, means responsive to said variable input signal for non-linearly amplitude modulating said DC supply voltage, means for applying said modulated DC voltage to said amplifier DC power input, means responsive to said variable input signal for non-linearly amplitude modulating said RF drive signal, means for applying said modulated RF drive signal to said amplifier RF drive input, and wherein said amplitude modulating means modulates said DC power input and said RF drive signal at non-linear levels to generate a modulated RF signal having positive envelope modulation primarily resulting from said modulated DC voltage and negative envelope modulation primarily resulting form said modulated RF drive signal.

13. A high efficiency method for operating an RF power amplifier for an amplitude modulated RF signal, sad amplifier having DC power and RF drive inputs, said method comprising the steps of non-linearly amplitude modulating a DC supply voltage in response to a variable input signal, applying said amplitude modulated DC voltage to said amplifier DC power input, generating an RF drive signal, non-linearly amplitude modulating said RF drive signal in response to said variable input signal, applying said modulated RF drive signal to said amplifier RF drive input, and wherein said DC power input and said RF drive signal are non-linearly amplitude modulated to establish an amplifier output having positive envelope modulating resulting primarily from said modulated DC voltage and negative envelope modulation resulting primarily from said modulated RF drive signal.

* * * * *